United States Patent [19]

Nakatsugawa

[11] 4,386,139
[45] May 31, 1983

[54] COPPER FOIL FOR A PRINTED CIRCUIT AND A METHOD FOR THE PRODUCTION THEREOF

[75] Inventor: Hiroshi Nakatsugawa, Yokohama, Japan

[73] Assignee: Furukawa Circuit Foil Co., Ltd., Tokyo, Japan

[21] Appl. No.: 202,661

[22] Filed: Oct. 31, 1980

[51] Int. Cl.$^3$ ............................................. C25D 3/56
[52] U.S. Cl. .............................. 428/607; 428/674; 204/43 Z
[58] Field of Search ............... 428/606, 607, 676, 684, 428/674; 204/12, 13, 27, 28, 43 Z, 54 L; 174/126 CP; 156/150, 157

[56] References Cited

U.S. PATENT DOCUMENTS

| | | | |
|---|---|---|---|
| 3,585,010 | 6/1971 | Luce | 156/151 |
| 3,857,681 | 12/1974 | Yates | 204/40 |
| 3,954,420 | 5/1976 | Hyner | 204/40 |
| 3,998,601 | 12/1976 | Yates | 428/607 |
| 4,088,544 | 5/1978 | Hutkin | 204/12 |
| 4,229,267 | 10/1980 | Steinecker | 204/55 R |
| 4,234,395 | 11/1980 | Berdan | 204/12 |
| 4,251,329 | 2/1981 | Asuno | 204/43 Z |
| 4,293,617 | 10/1981 | Nagy | 204/12 |

FOREIGN PATENT DOCUMENTS 55-102288  8/1980  Japan .
173003  4/1965  U.S.S.R. .

OTHER PUBLICATIONS

*Chemical Abstracts,* Abstract No. 77:38154f, Sebisty, J. J., "Elevated-Temperature Peeling Failure of Galvanized Coatings", 1977.

*Primary Examiner*—L. Dewayne Rutledge
*Assistant Examiner*—J. J. Zimmerman
*Attorney, Agent, or Firm*—Frishauf, Holtz, Goodman & Woodward

[57] ABSTRACT

Copper foil for a printed circuit, which comprises a copper layer and a vanadium-containing zinc layer formed on one side or each side of said copper layer, and a method for producing the copper foil. The bonding surface preferably contains a chromate surface.

14 Claims, No Drawings

COPPER FOIL FOR A PRINTED CIRCUIT AND A METHOD FOR THE PRODUCTION THEREOF

The present invention relates to copper foil for a printed circuit and a method for the production thereof. Particularly, the present invention relates to copper foil to be used for the production of a copper laminated board for a printed circuit, which comprises copper foil having a vanadium-containing zinc layer coated thereon, and a method for the production thereof.

Printed circuits are widely used in a variety of electronic application such as radios, televisions, computors, or telephone exchangers. There have recently been remarkable developments in this field and accordingly there is an increasing need for high quality boards for printed circuits.

With conventional copper laminated boards for printed circuits, it frequently happens that brown stains or spots appear at the interface between the copper foil and the substrate resin layer. (The surface which is in contact with the resin layer will hereinafter be referred to as "a bonding surface of the copper foil".) Such stains impair the outer appearance of the circuit and adversely affect the dielectric properties of the resin. Further, there has been a recent tendency that an increasing number of heat treatments at high temperatures are involved during the process for the production of boards for printed circuits, whereby the adhesion between the copper foil and the resin is likely deteriorate due to thermal degradation thus leading to a serious practical problem. The formation of the brown stains and deterioration in the adhesion between the copper foil and the resin, are believed to be caused mainly by chemical reactions between the copper foil and the resin layer. However, no adequate analysis of the causes has yet been done.

The following methods have been proposed to overcome these drawbacks.

U.K. Pat. No. 1,211,494 describes a method in which 0.2 to 1.0 g/m$^2$ of nickel, cobalt, chromium or stainless steel is plated on the bonding surface of the copper foil for a printed circuit. Japanese Patent Publication No. 35711/1976 discloses a method in which at least $10.16 \times 10^{-6}$ cm (i.e., 4 microinches) of indium, zinc, tin, nickel, cobalt, a copper-zinc alloy or a copper-tin alloy is electrodeposited on the surface of copper foil. Further, Laid-open Japanese Patent Application No. 16863/1974 describes a method in which a layer of a metal which is less noble than copper, such as aluminum, chromium, manganese, iron, cobalt, nickel, zinc, cadmium, tin, lead or indium, or its alloy with copper or with other metals, such as copper-zinc, copper-cadmium, copper-tin, or tin-zinc, is formed on the surface of copper foil.

Among these metals which form a layer on a copper foil, nickel, tin, cobalt and a copper-tin alloy, have the drawback that they are hardly dissolved by an ammonium persulfate solution which is one of the etchants commonly used in the printed circuit operations.

On the other hand, in the method for plating a zinc layer or a copper-zinc alloy layer, it is necessary to form the metal layer to have a thickness of substantially more than $10.16 \times 10^{-6}$ cm. in order to obtain sufficient performance for preventing stain formation and thermal degradation. However, a thick metal layer brings about the following drawbacks, and thus there are still difficult practical problems with copper foils having such a metal layer.

One of the drawbacks is that in the case of zinc plating, a so-called undercutting phenomenon occurs wherein the etchant penetrates into the interface between the copper foil constituting a circuit and the substrate beneath the copper foil, unless the plated metal layer is sufficiently thin. Another drawback is that the purity of the copper foil as being copper, is degraded due to the thick plated metal, whereby electrical properties of the copper foil are degraded. Specifically, if zinc or a 35% zinc-copper alloy is plated on a copper foil having a thickness of 35$\mu$, which is most commonly used for printed circuits, to have the abovementioned thickness, i.e., $10.16 \times 10^{-6}$ cm., the zinc content becomes about 0.24% or about 0.1%, respectively, of the total amount. Recently, with improvement of boards for printed circuits, there is a tendency that the thickness of the copper foil becomes thinner than ever e.g., to a level of 18$\mu$, 12$\mu$, or even 5$\mu$. Accordingly, the proportion of zinc in such thin copper foil tends to increase and it becomes harder to obtain the desired level of performance for the copper foil. A further drawback is that with an increase in thickness of the plated layer, it becomes harder to control the roughness of the foil surface. A still further drawback is that it is disadvantageous and not economical from the standpoint of the time required for the treatment and the cost for the plating materials that the plated layer is required to be thick. Another drawback is that in the case of electroplating a zinc-copper alloy, there is no other practical way than employing a cyanide bath which brings about difficult problems in respect of the working environment and pollution. Whereas in the case of zinc electroplating, stabilized plating can be done even with use of a sulfate bath or an alkaline bath such as a sodium zincate bath. Zinc electroplating does not have the drawbacks of zinc-copper plating, and is economically advantageous.

When copper foil for a printed circuit is laminated upon a substrate, the copper foil may be used either as an outer layer of a copper laminated board or as an inner layer of a multi layer copper laminated board. In the latter case, both sides of the copper foil are employed as bonding surfaces, and in the former case, one side of the copper foil is employed as the abovementioned bonding surface while the other side thereof is exposed on the surface of a completed printed circuit so that the exposed side is later printed with a resist ink and treated with a solder. (The surface which does not contact the resin layer will hereinafter be referred to as "non-bonding or untreated surface".)

With conventional copper foil for a printed circuit, a so-called untreated surface of the copper foil, which constitutes a circuit pattern on a substrate, tends to be oxidized and undergo a colour change due to the heat at the time the copper foil is laminated on the substrate, thus resulting in an inferior outer appearance and providing poor affinity to a resist ink and poor solderability unless it is further subjected to a grinding (buffing) operation. Even when there is no colour change by oxidation, there still remains a drawback that the solderability is not adequate for recent high speed soldering. Accordingly, it is desired that the treatment for forming a layer on the bonding surface of the copper foil for a printed circuit, should not impair the required properties such as non-susceptibility to colour change by oxidation of the untreated surface, and good solderability at the time of soldering without requiring a further treatment such as surface grinding, but should rather improve them. Namely, in the case where copper foil is passed through a solution to treat the bonding surface thereof, the untreated surface should not adversely be affected through contact with the solution or by the influence of the electrolysis such as giving rise to susceptibility to oxidation and colour change at the time of lamination or deterioration of the solderability, and it is rather desired to improve these properties.

Under these circumstances, it is an object of the present invention to provide copper foil having, on the bonding surface thereof, a metal layer which has a minimum thickness, forms no stains, provides a great bonding strength between the copper foil and the substrate resin prior to and after the heating, and presents no undercutting phenomenon, and, on the untreated surface thereof, a surface which is not susceptible to oxidation or colour change at the time of lamination, provides good solderability and has good corrosion preventive effect, by means of zinc plating. As a result of an extensive research, it has been found that copper foil having a vanadium-containing zinc layer rather thickly on its bonding surface and extremely thinly on the untreated surface thereof, completely satisfies the above requirements. The present invention is based on this discovery.

Now, the copper foil having a vanadium-containing zinc layer according to the invention and a method for its production will be described in further detail.

Copper foil for the basic copper layer may be any copper foil normally used for a printed circuit, for instance, such as electrodeposited copper foil or rolled copper foil. Further, it may be subjected to a surface roughening treatment such as etching by acid pickling, or a surface roughening treatment by electrodeposition as disclosed in U.S. Pat. No. 3,220,897 or 3,293,109.

The vanadium-containing zinc layer formed on the bonding surface of the copper foil should preferably have a thickness of 0.002 to 0.5 micron, more preferably 0.01 to 0.3 micron. If the thickness is less than 0.002 micron, the formation of the layer is not noticeable and no adequate effect for the purpose of the present invention is obtainable. If the thickness is as great as 1 micron, there appear the above mentioned drawbacks resulting from the excessive thickness. On the other hand, the thickness of the corresponding layer on the untreated surface of the copper foil, is preferably 0.0005 to 0.0015 micron, more preferably about 0.001 micron. If the thickness is less than this level, no adequate effect for the purpose of the present invention is obtainable, and if the thickness reaches a level of 0.002 micron, the surface after the treatment tends to show a colour of the plated zinc, and after the heating for lamination, the copper surface shows a brass (copper-zinc alloy) colour of the alloy, thus leading to undesirable results.

The vanadium contained in the zinc layer is uniformly distributed in the zinc layer in an amount of 0.05 to 10% by weight, preferably 0.2 to 6% by weight, based on the amount of zinc.

The copper foil having the zinc layer according to the present invention, may be produced by any one of an electroplating method, a chemical plating method, a molten salt electrolytic method, a solid plating method, a hot dipping method, a sputtering method, a metal spraying method and an electrodeposition from an organic solvent bath. The electroplating method is most preferred among them. In cases when this most preferred electroplating method is applied, the copper foil according to the present invention is prepared by the method exemplified as follows. Namely, a vanadium-containing layer is formed on the bonding surface and/or the untreated surface of the copper foil in accordance with a normal method with use of a zinc plating bath in which a vanadium compound soluble in the zinc plating bath is dissolved.

According to the electroplating method of the present invention, the plating conditions such as the composition of the zinc plating bath, the bath temperature or the current density, may be the same as in a usual zinc electroplating method except for the addition of a vanadium compound, and do not require any specific method. The electroplating bath may be any one of a cyanide bath, an alkaline bath and an acidic bath, the alkaline bath being preferred.

In the examples, a bath is shown which contains zinc sulfate or zinc oxide as the main constituent and sodium hydroxide. However, a different kind of an alkaline zinc plating bath may be used. Further, an additive such as a brightening agent (brightener) may be added to the bath. The bath temperature is normally kept at room temperature, but the bath may be heated. The current density is normally within a range of 0.1 to 10 A/dm$^2$ but may be higher or lower. In the case of the solution used in Example 1 of the present invention, electroplating is observed even at a current density of 0.1 A/dm$^2$ and it has been confirmed that the plated layer contains vanadium. However, more uniform plating is attainable at a current density of 0.2 A/dm$^2$ or higher. Further, from the standpoint of the speed of the treatment of the bonding surface, a current density of 1 A/dm$^2$ or higher is preferred.

The vanadium compound to be added to the zinc solution may be any vanadium compound so long as it is soluble in the zinc solution, such as ammonium metavanadate, sodium metavanadate, sodium orthovanadate, vanadium pentoxide, vanadium oxyoxalate, vanadium acetylacetone or vanadyl sulfate. These metal salts may be added to the electrolytic solution in an amount of 0.01% by weight or more, preferably 0.1% by weight or more, based on the amount of zinc in the bath. For instance, in case ammonium metavanadate is added to an alkaline zinc bath containing 2.7 g/l of zinc at room temperature, the effectiveness becomes distinct when the amount of addition reaches the level which corresponds to 0.01 g/l of vanadium.

The effectiveness of the copper foil having a vanadium-containing zinc layer according to the invention is further enhanced by forming a chromic acid treated coating (chromate layer) on the zinc layer. For instance, after washing with water, the copper foil provided with a vanadium-containing zinc layer, is treated with an alkaline chromic acid solution or a chromic acid solution to form a chromate layer on the zinc layer, and after applying a butyral-phenol resin type adhesive on the chromate layer, the copper foil is laminated on a phenol substrate, whereby the adhesion between the copper foil and the resin is remarkably improved. The improvement in the bonding strength in the case of a glass-epoxy resin substrate is not so remarkable as in the case of the phenol substrate, as the effectiveness of the vanadium-containing zinc layer is great, but it is still preferred to provide the chromate layer. The chromate layer may be formed preferably by a solution which contains 0.1 to 10 g/l of chromic acid and 0.1 to 10 g/l of sodium hydroxide, or which contains 0.1 to 10 g/l of chromic acid only. The treating may preferably be carried out by dipping, cathodic electrolysis, or anodic electrolysis. In the treatment, either cold or hot solution containing chromic acid may be used.

The copper foil having a vanadium-containing zinc layer and further a chromate layer provided thereon, showed excellent results when used as a conductive element for a copper laminated board for a printed circuit. Namely, when it was laminated on a glass-epoxy substrate, no brown stains were observed at the interface between the copper foil and the substrate resin layer, and the bond strength measured after the lamination showed a sufficiently high value, which was not substantially degraded even after heating at 300° C. for 3 minutes or at 180° C. for 5 hours. Further, at the time of etching, the portions of the foil to be etched, could easily and completely be removed, and penetration of the etchant into the interface between the copper foil and the substrate resin (i.e., undercut), which would be observed in the case when no additional element is used in the zinc layer, was not observed. Further, when the copper foil was laminated on a polyimide substrate, greenish brown stains which would conventionally be observed on the substrate after removal of copper the etching operation, were not observed at all. Furthermore, when the copper foil was laminated on a phenol substrate, the bonding strength was improved. Further, when the copper foil is heated and pressed to form a laminated board, a colour change due to oxidation of the copper foil surface, which used to be observed with the conventional copper foil, was not observed at all, and the solderability at the time of soldering was quite satisfactory.

Thus, according to the present invention, the drawbacks in quality inherent to the conventional products are eliminated, the proportion of defective products is minimized, the quality of the products is improved, and the grinding step can be omitted. Thus, great qualitative and economical advantages are obtainable.

Further, the copper foil treated according to the present invention is usually one in which both the bonding surface and the untreated surface are treated by the present invention. It is needless to say, however, that depending upon the application, the copper foil may be the one in which only the bonding surface or the untreated surface is treated by the present invention.

Now, the invention will be described in more detail with reference to working examples. However, it should be understood that the present invention is not limited by these examples.

EXAMPLE 1

With use of a solution containing 18 g/l of zinc sulfate (heptahydrate), 70 g/l of sodium hydroxide and 0.5 g/l of ammonium metavanadate at room temperature as the electrolytic bath, electroplating was applied to the matte side (i.e., the bonding surface) of electrodeposited copper foil having a thickness of 35 microns, at a current density of 3.3 A/dm$^2$ for 5.6 seconds and, at the same time, to the shiny side (i.e., the untreated surface) of the same electrodeposited copper foil at a current density of 0.45 A/dm$^2$ for 2 seconds. The amount of electrodeposition of zinc per apparent surface area of the matte surface, is about 0.3 g/m$^2$ which corresponds to a thickness of about 0.04 micron, and the shiny side remained with a copper colour. The foil was washed with water and dried, and it was then subjected to the measurement of the vanadium content in the plated zinc layer according to the usual method. The results of the measurement are shown in Table 1. The copper foil was dipped at room temperature for 5 seconds in a solution containing 3 g/l of chromic acid and 3.4 g/l of sodium hydroxide, washed with water, dried and then laminated on a glass-epoxy substrate via an adhesive. The results obtained by measuring various properties as the laminated board, are shown in Table 1.

EXAMPLE 2

With use of a solution containing 12 g/l of zinc sulfate (heptahydrate), 65 g/l of sodium hydroxide, and 1.2 g/l of sodium metavanadate at room temperature as the electrolyte, electroplating was applied to the respective matte side and shiny side of electrodeposited copper foil under the same conditions as in Example 1. The amount of electrodeposition of zinc per apparent surface area of the matte side, is about 0.2 g/m$^2$ which corresponds to a thickness of 0.027 micron.

The same treatments as in Example 1 were conducted, and the results obtained from the measurement of various properties, are shown in Table 1.

EXAMPLE 3

With use of a solution containing 24 g/l of zinc sulfate (heptahydrate), 80 g/l of sodium hydroxide and 0.4 g/l of vanadium pentoxide at room temperature as the electrolyte, electroplating was applied to the respective matte side and shiny side of electrodeposited copper foil under the same conditions as in Example 1. The amount of electrodeposition of zinc per apparent surface area of the matte side, was about 0.33 g/m$^2$ which corresponds to a thickness of about 0.045 micron.

The same treatment as in Example 1 were conducted, and the results obtained from the measurement of various properties, are shown in Table 1.

EXAMPLE 4

With use of a solution containing 4 g/l of zinc oxide, 50 g/l of sodium hydroxide, and 0.6 g/l of ammonium metavanadate at room temperature as the electrolyte, electroplating was applied to the matte side of electrodeposited copper foil having a thickness of 35 microns, at a current density of 6 A/dm$^2$ for 7 seconds, and, at the same time, to the shiny side of the same electrodeposited copper foil, at a current density of 0.2 A/dm$^2$ for 6 seconds. The amount of electrodeposition of zinc per apparent surface area of the matte side was about 0.3 g/m$^2$ which corresponds to a thickness of about 0.04 micron, and the shiny side remained with a copper colour.

The same treatments as in Example 1 were conducted, and the results obtained from the measurement of various properties, are shown in Table 1.

COMPARATIVE EXAMPLE 1

With use of a solution containing 18 g/l of zinc sulfate (heptahydrate), and 70 g/l of sodium hydroxide at room temperature as the electrolyte, electroplating was applied to the respective matte side and shiny side of electrodeposited copper foil under the same conditions as in Example 1. The amount of electrodeposition of zinc per apparent surface area of the matte side, was about 0.3 g/m$^2$ which corresponds to a thickness of about 0.04 micron, and the shiny side remained with a copper colour.

The same treatments as in Example 1 were conducted, and the results obtained from the measurement of various properties, are shown in Table 1.

COMPARATIVE EXAMPLE 2

Only the chromic acid treatment was applied in the same manner as in Example 1 to the same electrodeposited copper foil as used in the preceding Examples without applying any electroplating. The results obtained by measuring the same properties as in Example 1, are shown in Table 1.

Example 1, and this copper foil was laminated in the same manner as in Example 5. The result obtained by measuring the peeling strength, is shown in Table 2.

COMPARATIVE EXAMPLE 4

Copper foil having a zinc layer containing no vanadium, was prepared under the same conditions as in Example 1, and a chromate layer was formed thereon under the same conditions as in Example 7, and thereafter the copper foil was washed with water, dried, and laminated in the same manner as in Example 5.

TABLE 1

| | Shiny side (untreated surface) | | Matte side (bonding surface) | | | | | |
|---|---|---|---|---|---|---|---|---|
| | Colour change by oxidation of the shiny side at the time of lamination | Solderability | Ratios of vanadium to zinc in the plated zinc layer (% by weight) | Undercutting upon etching | | Peeling strength of copper foil laminated on a glass-epoxy substrate* (kg/cm) | | Brown stains observed on the substrate after removal of copper foil by etching |
| | | | | Etching condition A | Etching condition B | No heat treatment after lamination | After heating at 300° C. for 3 minutes after lamination | |
| Example 1 | None | Good | 2 | None | None | 2.1 | 1.8 | None |
| Example 2 | None | Good | 7 | None | None | 2.1 | 1.8 | None |
| Example 3 | None | Good | 4 | None | None | 2.1 | 1.8 | None |
| Example 4 | None | Good | 5 | None | None | 2.2 | 1.9 | None |
| Comparative Example 1 | None | Good | — | Large | Almost none | 2.1 | 1.6 | Almost none |
| Comparative Example 2 | Yes | Bad | — | None | None | 2.4 | 1.4 | Yes |

Etching condition A: Etching was conducted at 45° C. for 15 minutes with use of an etchant containing 200 g/l of $CuCl_2 \cdot 2H_2O$ and 150 g/l of HCl.
Etching condition B: Etching was conducted at 45° C. for 13 minutes with use of an etchant containing 250 g/l of $(NH_4)_2S_2O_8$ and 50 g/l of $H_3PO_4$.
*Peeling strength test: JIS C 6481-1976, Paragraphs 5-7.

EXAMPLE 5

Copper foil plated with use of the same electrolyte as in Example 1 and under the same conditions, was laminated on a phenol substrate via a butyral-phenol resin type adhesive. The result obtained by measuring the peeling strength, is shown in Table 2.

EXAMPLE 6

Copper foil provided with a vanadium-containing zinc layer under the same conditions as in Example 1, was immersed in a solution containing 3 g/l of chromic acid and 3.4 g/l of sodium hydroxide at room temperature for 5 seconds, washed with water, dried, and then laminated in the same manner as in Example 5. The result obtained by measuring the peeling strength, is shown in Table 2.

EXAMPLE 7

Copper foil provided with a vanadium-containing zinc layer under the same conditions as in Example 1, was subjected to cathodic electrolysis in a solution containing 3 g/l of chromic acid and 3.4 g/l of sodium hydroxide at room temperature at 3 A/dm² for 5 seconds, washed with water, dried and then laminated in the same manner as in Example 5. The result obtained by measuring the peeling strength, is shown in Table 2.

COMPARATIVE EXAMPLE 3

Copper foil having a zinc layer containing no vanadium, was prepared under the same conditions as in The result obtained by measuring the peeling strength, is shown in Table 2.

TABLE 2

| | Chromic acid treatment | Peeling strength (kg/cm) |
|---|---|---|
| Example 5 | None | 0.8 |
| Example 6 | Immersion at room temperature for 5 seconds | 1.4 |
| Example 7 | Cathodic electrolysis at room temperature at $3A/dm^2$ for 5 seconds | 1.9 |
| Comparative Example 3 | None | 0.5 |
| Comparative Example 4 | Cathodic electrolysis at room temperature at $3A/dm^2$ for 5 seconds | 1.1 |

It is apparent from the comparison of Comparative Example 3 and Example 5 that the vanadium-containing zinc layer provides a superior peeling strength, and it is also apparent from Examples 6 and 7 that the peeling strength is improved by the formation of the chromate layer. Thus, it is apparent that with use of the copper foil for a printed circuit according to the present invention, substantial qualitative and economical advantages are obtainable.

What is claimed is:

1. Copper foil for a printed circuit, which comprises a copper layer having at least one surface thereof coated with a layer consisting essentially of a vanadium-containing zinc.

2. The copper foil for a printed circuit as claimed in claim 1, wherein the vanadium content in the vanadium-containing zinc layer is 0.05 to 10% by weight based on the amount of zinc.

3. The copper foil for a printed circuit as claimed in claim 2, wherein the vanadium content in the vanadium-containing zinc layer is 0.2 to 6% by weight based on the amount of zinc.

4. The copper foil for a printed circuit as claimed in claim 1, wherein said vanadium-containing zinc layer has a chromate layer on its surface.

5. The copper foil for a printed circuit as claimed in claim 4, wherein the vanadium content in the vanadium-containing zinc layer is 0.05 to 10% by weight based on the amount of zinc.

6. The copper foil for a printed circuit as claimed in claim 5, wherein the vanadium content in the vanadium-containing zinc layer is 0.2 to 6% by weight based on the amount of zinc.

7. The copper foil for a printed circuit as claimed in any one of claims 1 to 6, wherein said vanadium-containing zinc layer has a thickness of 0.002 to 0.5 micron and is formed on at least one surface of the copper layer which is intended to be bonded to another material.

8. The copper foil for a printed circuit as claimed in claim 7, wherein and vanadium-containing zinc layer has a thickness of 0.01 to 0.3 micron.

9. The copper foil for a printed circuit as claimed in any one of claims 1 to 6, wherein said vanadium-containing zinc layer has a thickness of 0.0005 to 0.0015 micron and is formed on a surface of the copper layer which is intended not to be bonded to another material.

10. The copper foil for a printed circuit as claimed in claim 9, wherein said vanadium-containing zinc layer has a thickness of about 0.001 micron.

11. The copper foil for a printed circuit as claimed in claim 1, wherein the surface of said vanadium-containing zinc layer has been treated with chromic acid.

12. A method for producing copper foil for a printed circuit, which comprises electroplating a vanadium-containing zinc layer on at least one of the bonding surface and the untreated surface of copper foil from a plating solution comprising a zinc plating solution having a vanadium compound dissolved therein.

13. The method as claimed in claim 12, wherein said zinc plating solution is an alkaline zinc salt solution.

14. The method as claimed in claim 12, wherein the surface of said vanadium-containing zinc layer is further treated with chromic acid.

* * * * *